(12) United States Patent
Liu et al.

(10) Patent No.: US 10,323,313 B2
(45) Date of Patent: Jun. 18, 2019

(54) METHOD OF METAL COATING AND COATING PRODUCED THEREBY

(75) Inventors: Qiyang Liu, Mount Keira (AU); David James Nolan, Gerringong (AU)

(73) Assignee: Bluescope Steel Limited, Melbourne, Victoria (AU)

( * ) Notice: Subject to any disclaimer, the term of this patent is extended or adjusted under 35 U.S.C. 154(b) by 0 days.

(21) Appl. No.: 12/747,583

(22) PCT Filed: Dec. 9, 2008

(86) PCT No.: PCT/AU2008/001811
§ 371 (c)(1),
(2), (4) Date: Jul. 6, 2010

(87) PCT Pub. No.: WO2009/073917
PCT Pub. Date: Jun. 18, 2009

(65) Prior Publication Data
US 2010/0266866 A1 Oct. 21, 2010

(30) Foreign Application Priority Data
Dec. 11, 2007 (AU) ................. 2007906721

(51) Int. Cl.
*C23C 2/02* (2006.01)
*C23C 2/12* (2006.01)
(Continued)

(52) U.S. Cl.
CPC ............. *C23C 2/02* (2013.01); *C23C 2/12* (2013.01); *C23C 2/26* (2013.01); *C23C 2/28* (2013.01); *C23C 14/16* (2013.01); *C23C 16/06* (2013.01); *C25D 5/48* (2013.01); *C25D 5/50* (2013.01); *C25D 7/0614* (2013.01); *C25D 9/08* (2013.01);
(Continued)

(58) Field of Classification Search
USPC ...................... 427/430.1, 431, 433
See application file for complete search history.

(56) References Cited

U.S. PATENT DOCUMENTS 2,310,451 A * 2/1943 Marshall ............... C23C 2/02
148/256
4,143,184 A * 3/1979 Paulus .................. C21D 9/56
118/65
(Continued)

FOREIGN PATENT DOCUMENTS

GB 896866 5/1962
JP 58177446 A * 10/1983
(Continued)

OTHER PUBLICATIONS

PCT/AU2008/001811 International Search Report.
(Continued)

*Primary Examiner* — David P Turocy
(74) *Attorney, Agent, or Firm* — Michael Best & Friedrich LLP

(57) ABSTRACT

A method for coating a metal substrate, such as a steel strip, is disclosed. The method comprises vapor or electro-depositing an alloy control material, as described herein, onto the substrate and passing the substrate through a bath of molten coating material and forming a coating of the coating material onto the deposited alloy control material.

2 Claims, 2 Drawing Sheets

(51) Int. Cl.
*C23C 2/26* (2006.01)
*C23C 2/28* (2006.01)
*C23C 14/16* (2006.01)
*C23C 16/06* (2006.01)
*C25D 5/48* (2006.01)
*C25D 5/50* (2006.01)
*C25D 7/06* (2006.01)
*C25D 9/08* (2006.01)

(52) U.S. Cl.
CPC ............... *Y10T 428/12493* (2015.01); *Y10T 428/31678* (2015.04)

(56) References Cited

U.S. PATENT DOCUMENTS

| | | | |
|---|---|---|---|
| 4,610,936 A * | 9/1986 | Isobe et al. | 428/659 |
| 4,812,371 A * | 3/1989 | Shindou et al. | 428/659 |
| 5,091,150 A * | 2/1992 | Memmi et al. | 420/541 |
| 5,312,531 A * | 5/1994 | Nishimura et al. | 204/206 |
| 5,491,036 A * | 2/1996 | Carey, II | B32B 15/18 |
| | | | 428/646 |
| 5,494,706 A * | 2/1996 | Abe et al. | 427/329 |
| 5,789,089 A | 8/1998 | Maki et al. | |
| 6,635,359 B1 * | 10/2003 | Kurosaki et al. | 428/653 |
| 6,811,827 B2 * | 11/2004 | Brisberger | C23C 2/40 |
| | | | 118/419 |
| 2001/0051225 A1 * | 12/2001 | Van Ooij et al. | 427/433 |

FOREIGN PATENT DOCUMENTS

| | | | |
|---|---|---|---|
| JP | 58177450 A * | 10/1983 | |
| JP | 03-024255 | 2/1991 | |
| JP | 03281788 | 12/1991 | |
| JP | 04-002785 | 1/1992 | |
| JP | 04028852 | 1/1992 | |
| JP | 04-63259 | 2/1992 | |
| JP | 04063259 A * | 2/1992 | |
| JP | 04-191355 | 7/1992 | |
| JP | 06-081170 | 3/1994 | |
| JP | 06158256 A * | 6/1994 | |
| JP | 06299327 A * | 10/1994 | |
| JP | 07-003417 | 1/1995 | |
| JP | 07252623 A * | 10/1995 | |
| JP | 2000-129467 | 5/2000 | |
| WO | WO 0101100 A1 * | 1/2001 | |

OTHER PUBLICATIONS

PCT/AU2008/001811 International Preliminary Report on Patentability.
Office Action from the Japanese Patent Office for Application No. 2010-537212 dated Nov. 27, 2013 (5 pages).

* cited by examiner

METHOD OF METAL COATING AND COATING PRODUCED THEREBY

TECHNICAL FIELD

A method of coating a metal substrate and a resultant coating produced thereby are disclosed. The method finds particular although not exclusive application in the field of zinc/aluminium-type coatings on steel substrates.

BACKGROUND ART

One known method of coating a metal substrate comprises hot dipping steel strip in a molten bath of zinc and aluminium to form a coating of a zinc/aluminium alloy. This method is known as the ZINCALUME® process. Silicon (at around 1.5 wt %) may be added to the bath to prevent excessive alloying between the molten coating metal and the steel strip. In the absence of silicon, such alloying may occur so rapidly that the resultant heat generated can actually heat up the strip. The resultant coatings in the absence of silicon may therefore develop a thick (>20 μm), brittle Al—Fe—Zn alloy coating layer, rendering the product effectively useless. When silicon is present in the bath, a thin (~1 μm) Al—Fe—Zn—Si quaternary alloy layer can form, which acts as a blanket on the steel surface to separate the surface from the molten coating metal, thereby preventing rapid alloying and allowing a sufficient coating overlay to form.

However, the presence of silicon in the bath introduces other problems. For example, it has been observed that, during coating solidification, silicon needles precipitate out and grow within the coating. These silicon needles are often connected to the Al—Fe—Zn—Si quaternary alloy layer and can provide a corrosion pathway to the alloy layer. The silicon needles can also increase the brittleness of the coating layer. Also, the presence of silicon in the bath means that certain other bath additives, such as magnesium, may not be able to be used to produce desirable coating properties. For example, silicon reacts with magnesium to produce a brittle $Mg_2Si$ phase, which in turn increases the brittleness of the coating layer.

The above description is not to be taken as an admission of the common general knowledge.

SUMMARY OF THE INVENTION

The present invention provides a method for coating a metal substrate comprising the steps of:

(a) vapour or electro-depositing an alloy control material, as described herein, onto the substrate; and (b) passing the substrate through a bath of molten coating material, and forming a coating of the coating material onto the deposited alloy control material.

The term "alloy control material" as employed throughout this specification refers to a material that controls the degree of alloying between the metal of the metal substrate and one of more components of the coating material.

By vapour or electro-depositing an alloy control material layer on the metal substrate before passing it through the molten material bath, a similar or improved effect to bath silicon may be achieved in a bath of zinc, aluminium, and silicon for forming a coating on a steel substrate. The alloy control material may also form an alternative (for example, even thinner) alloy layer on the steel substrate to achieve an enhanced effect to that of bath silicon, and with less material. Thus, where for example the vapour deposited alloy control material is silicon, less material can be deposited than that required in a molten bath, and yet the same or an enhanced alloy control outcome may be achieved.

Further, the bath may be formulated to be free of silicon and this can in turn facilitate a silicon-free and hence more ductile coating layer. In addition, other additives such as magnesium may then be introduced into the bath.

Notwithstanding the preceding paragraph, the method may comprise adding the alloy control material to the bath of molten coating material to minimise dissolution of the vapour or electro-deposited alloy control material from the substrate as the substrate passes through the bath of molten coating material. For example, if silicon is the alloy control material and the molten bath is silicon-free, there is a very strong driving force for dissolution of silicon from the vapour or electro-deposited silicon on the substrate as the substrate passes through the molten bath once wetting occurs, at least until an equilibrium between the substrate and the molten bath in relation to silicon is reached.

The method may comprise minimising formation of oxides on the vapour or electro-deposited alloy control material. Preferably there are no oxides on the vapour or electro-deposited alloy control material on the substrate that enters the bath of molten coating material. The method may comprise forming a coating of zinc on the vapour or electro-deposited alloy control material before transferring the substrate to the bath of molten coating material.

The alloy control material may be deposited on the substrate by a physical or chemical vapour deposition technique or an electro-deposition technique (as described hereafter).

In this regard, the alloy control material may be deposited onto the substrate as a layer having a sufficient thickness to prevent excessive alloying between the metal of the metal substrate and one or more components of the coating material.

The layer may be a continuous layer.

The layer of the alloy control material may be relatively thin compared to the coating layer, for example of the order of 0.01-1.0 μm, and preferably less than 0.5 μm.

The alloy control material may be a material that is capable of forming an alloy with both the metal of the metal substrate and one or more components of the coating material, to thereby enable forming the coating of the coating material onto the alloy control material.

In situations in which the coating material is an alloy of zinc and aluminium, the alloy control material may comprise any one or more of Si, Ti, Mn, Ni, Nb, Ta, W, and Zn, especially when the metal substrate comprises a steel.

Whilst vapour or electro-depositing Si may be optimal, as it can simulate the function of Si in the bath, the vapour or electro-deposition of alternative materials such as Ti, Mn, Ni, Nb, Ta, W, Zn etc can achieve similar and other beneficial effects, such as a modified crystalline structure of the alloy layer for improved coating ductility.

The metal substrate may comprise a steel.

The metal substrate may be in the form of a sheet, more particularly a metal, such as a steel, strip.

In addition, the bath of molten coating material may comprise zinc and aluminium.

The zinc and aluminium bath may contain at least 10 wt. % zinc, preferably at least 20 wt. % zinc.

A typical zinc and aluminium bath may comprise 55 wt % and 45 wt % respectively of aluminium and zinc.

The bath of molten coating material may contain zinc, aluminium, and silicon in the following ranges, in wt. %:

Aluminium: 40-60
Zinc: 40-60
Silicon: 0.3-3

Where the metal substrate comprises a steel, and the bath comprises zinc and aluminium, the alloy that forms with the deposited alloy control material (ACM) may comprise an Al—Fe—Zn—ACM quaternary alloy (for example, an Al—Fe—Zn—Si quaternary alloy when the ACM is Si).

The bath of molten coating material may further comprise magnesium. Magnesium can function to enhance the corrosion resistance of the coating layer e.g. in acidic or salty environments, especially at cut edges where the boundary between substrate and coating is exposed. The magnesium may be present in an amount up to 5 wt % of the bath material. In one embodiment, the magnesium may replace a corresponding portion of the zinc in the bath material. However, magnesium may also replace a proportion of Al, or both of Al and Zn, depending on the coating corrosion performance required and current metal costs.

The bath of molten coating material may not contain any one or more of the elements titanium, calcium, manganese, potassium, bismuth, cerium and lanthanum as deliberate additives.

The step of passing the substrate through the molten material bath may be a hot dipping process step.

The method may further comprise chemically cleaning the substrate prior to vapour or electro-depositing the alloy control material onto the substrate.

The present invention also provides a method for forming a coating of aluminium and zinc on a steel-containing substrate comprising the steps of:

(a) vapour or electro-depositing a material onto the substrate, the material being capable of forming an alloy with the iron in the steel and the aluminium and zinc in the coating; and (b) passing the substrate through a molten bath of zinc and aluminium and optionally no added silicon and forming a coating of zinc and aluminium on the substrate.

The vapour or electro-deposited material may be the above-described alloy control material.

The present invention also provides a metal substrate comprising a layer of a vapour or electro-deposited alloy control material as described above on at least one surface of the substrate.

The metal substrate may further comprise a coating of a coating material as described above.

The metal substrate may be a steel substrate.

The present invention also provides a coated substrate comprising a substrate, a layer of a vapour or electro-deposited alloy control material as described above on at least one surface of the substrate and a coating of the coating material as described above on the electro-deposited alloy control material layer.

The metal substrate may be a steel substrate.

For example, where the metal substrate comprises a steel, and the coating material comprises zinc and aluminium, and the alloy control material (ACM) forms an alloy with the coating material, the alloy comprises an Al—Fe—Zn-ACM quaternary alloy (for example, an Al—Fe—Zn—Si quaternary alloy when the ACM is Si).

BRIEF DESCRIPTION OF DRAWINGS

The present invention is described further, by way of example only, with reference to the accompanying drawings, of which.

DETAILED DESCRIPTION OF SPECIFIC EMBODIMENTS

Figure 1:
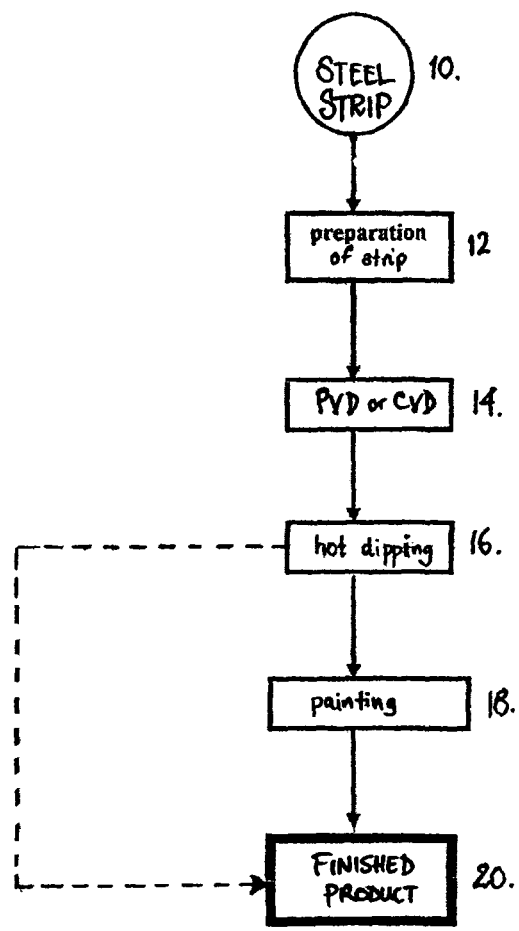
FIG. 1 is a process flow schematic for one embodiment of a method for coating a metal substrate, in this case, steel strip in accordance with the present invention.

Referring firstly to FIG. 1, a method for coating a metal substrate (typically steel strip) is schematically depicted. The coiled steel strip 10 is unwound and is then prepared for subsequent vapour or electro-deposition with an alloy control material. In this regard, typically the steel strip is chemically cleaned using an alkali solution and is then dried of chemical cleaning solution at station 12. Alternatively, a chemical solvent may be used for cleaning.

In one variation, prior to cleaning, the steel strip can be formed into its desirable profile (for example, corrugated, channel etc). However, as the subsequent vapour or electro-deposited layer is very thin, it is typically flexible. In addition, because the vapour or electro-deposited layer is mechanically locked to the steel strip surface, typically the layer can pass through rolls without flaking. Therefore, pre-forming of the strip is not essential.

The prepared strip is then passed to a vapour or electro-deposition stage 14 where it is subjected to either a physical vapour deposition (PVD) procedure, a chemical vapour deposition (CVD) procedure, or an electrodeposition procedure that form a layer of an alloy control material on the strip. The procedures are described in greater detail below.

More particularly, in stage 14, an alloy control material is deposited onto the strip, typically on both sides and on the edges thereof, to suitably prepare the strip for subsequent hot dipping in a molten bath. For example, a vapour of silicon may be deposited onto the strip at a thickness ranging from around 80 to 180 nanometers (nm), although the range may vary depending on the application.

The vapour or electro-deposited strip is then passed to hot dipping stage 16 in which it is immersed in a molten metal bath in a known manner to form a coating of the bath material on the strip. Typically the bath comprises molten zinc and aluminium, and optionally molten magnesium. A typical ratio of components is 55 wt % aluminium, 45 wt % zinc (or when magnesium is present, say 42 wt % zinc and 3 wt % magnesium).

As an optional step the strip may be heat-treated after the vapour or electro-deposition stage 14 and before hot dipping stage 16 so that the vapour or electro-deposited layer is pre-alloyed into the surface layer of the steel strip. In this case, the strip is made resistant to surface abrasion.

In addition, and where for example the vapour or electro-deposited material comprises silicon, heat-treating the strip after the vapour deposition stage 14 and before the hot dipping stage 16 makes for more ready availability of the Si and also Fe, to subsequently react with the molten coating to form a quaternary alloy layer (i.e. Fe does not need to diffuse through the Si layer). Heat-treating the strip can also minimise the risk of Si dissolving into the molten coating.

After dipping, the strip is quench cooled in stage 16. The strip is then either passed:

to a painting stage 18, where a desirably coloured paint is applied to the coated strip; or directly to a finished product stage 20, wherein the finished strip is cut into suitable lengths, packaged and distributed.

Again, the painted strip may be passed to this finished product stage after paint curing (for example, in a curing oven).

Deposition

As discussed above, in stage 14 the strip is subjected to either a physical vapour deposition, chemical vapour deposition or an electrodeposition procedure to deposit an alloy control material thereon.

Typical alloy control materials employed in the method include silicon, titanium, manganese, nickel, niobium, tantalum, tungsten and zinc. Silicon is an optimal alloy control material in that, at a relatively thin deposited layer, it can prevent excessive alloying between steel in the strip and aluminium (especially) in the molten metal bath. However, titanium, manganese and, to a lesser extent, nickel, niobium, tantalum and tungsten have been observed to also provide alloying control. Mixtures of these materials may also be employed, to provide complementary properties to the deposited layer.

Chemical Vapour Deposition (CVD)

In CVD a solid material is deposited onto a substrate from a gaseous phase. CVD processes include atmospheric pressure CVD, low pressure CVD, metal-organic CVD, plasma assisted and plasma enhanced CVD, laser CVD, photochemical vapour deposition, chemical vapour infiltration and chemical beam epitaxy.

Generally in each case, precursor gases (which may be diluted in carrier gases) are delivered into a reactor and passed over a heated substrate. The gases react or decompose at the substrate to form a solid phase which deposits onto the substrate. The substrate temperature is varied to induce the type of reaction desired.

Thus, for CVD at stage 14 the steel strip is heated in the reactor and a vapour comprising the alloy control material to be deposited is introduced into the reactor. In this regard, the material may be in the form of a compound which is more readily vaporised (for example, a metal-organic compound) and which, when contacting the heated metal substrate, reacts and decomposes to leave a deposited layer of the metal on the substrate (whilst breaking down the metal-organic compound).

Physical Vapour Deposition (PVD)

In PVD a material to be deposited transfers to a substrate at an atomic level. Whereas in CVD the precursor material is introduced into a reactor in a gaseous form, in PVD the material to be deposited commences the process in solid form. As examples of PVD procedures, both sputter coating and pulsed laser deposition can be employed at stage 14 to deposit the alloy control material.

In the PVD procedure, the alloy control material is first evaporated by bombarding the material with a high energy source, such as a beam of electrons or a pulsed laser, to dislodge atoms from the material surface and vaporise them. The vaporised atoms are then transferred to the metal substrate and directed thereon to progressively coat the substrate. This coating is continued until an optimal thickness layer is reached.

Electrodeposition

In the electrodeposition procedure, the alloy control material is deposited by the application of electric current to reduce dissolved cations from an electrolyte solution. The steel strip to be coated acts as the cathode in the electric circuit, and under the action of electric current, the dissolved cations of the alloy control material are reduced to metal at the cathode (that is, the steel strip) and are thereby plated onto the steel substrate. In one type of process, solid metallic anodes of the alloy control material dissolve providing a supply of cations to the electrolyte. In other cases, inert anodes can be applied, in which case the electrolyte solution must be regularly replenished with cations of the alloy control material by adding prepared electrolyte solutions or relevant salt compounds.

The thickness of the deposited layer is controlled to obtain optimal performance. In this regard, where the layer is too thin there is insufficient alloy control material to stop excessive alloying. Where the layer is too thick there is an insufficient alloying reaction of the deposited material with the substrate at external regions of the deposited layer. This insufficient reaction can affect the subsequent coating step. For example, it can result in poor coating adhesion to the deposited layer. It can also result in poor alloying between the coating and deposited layer, and may also result in a release of deposited alloy control material into the molten bath.

Figure 4:
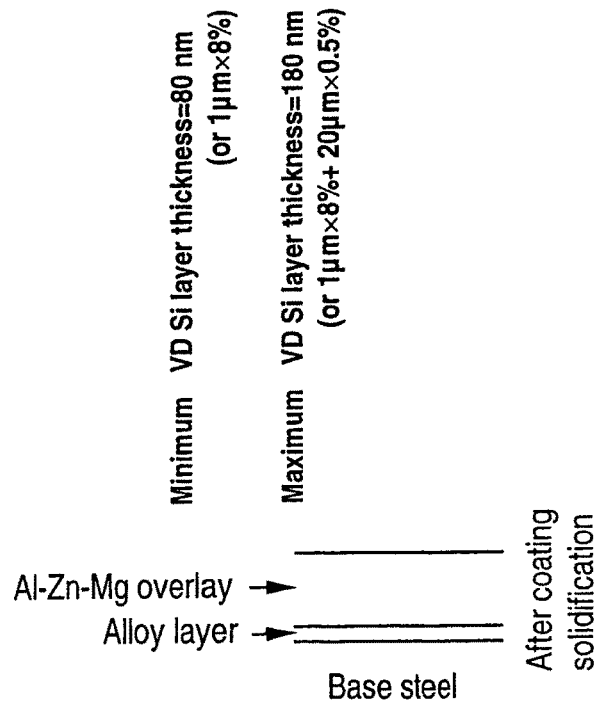
FIG. 4 schematically depicts the steel sheet/Si layer/coating of FIG. 3 after solidification.
Figure 3:
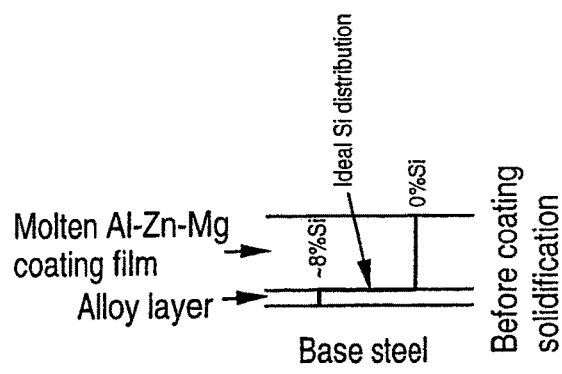
FIG. 3 schematically depicts the steel sheet and Si layer of FIG. 2 with a newly applied Al—Zn—Mg coating in accordance with a further embodiment of the present invention.
Figure 2:
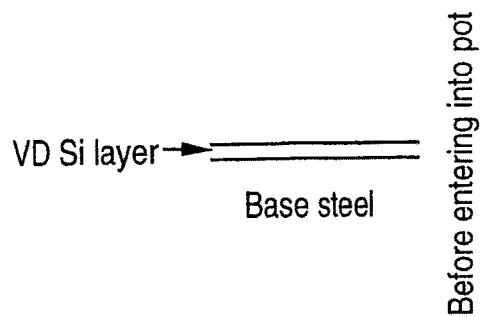
FIG. 2 schematically depicts one embodiment of a steel sheet with a vapour deposited Si layer in accordance with the present invention.

Reference is now made to FIGS. 2, 3 and 4 which depict the stages of layer formation in vapour deposition and subsequent coating.

Referring firstly to FIG. 2, the steel strip (base steel) is shown with a vapour deposited silicon layer thereon. In this regard, the minimum deposited layer has a thickness of 80 nm and a maximum thickness of 180 nm. This enables an alloy between Fe and Si to form throughout the deposited layer. Thus, the vapour deposition technique is typically regulated to provide a Si layer within this range.

Referring now to FIG. 3, the deposited steel substrate is now introduced into the molten metal bath in hot dipping stage 16 to enable a coating film to form as shown. The bath has no added silicon, with the silicon already being present in the vapour deposited layer in alloy with Fe. During application of the molten coating film, diffusion of aluminium and zinc atoms into the vapour deposition layer occurs and a quaternary alloy of Al—Fe—Zn—Si forms. This alloy formation also prevents excessive alloying (i.e. controls) between for example Al and Fe.

An advantageous silicon distribution is one where the subsequent alloy and the vapour deposition layer comprises approximately 8 wt. % silicon with the remainder comprising roughly 25 wt. % Fe, 56 wt. % Al and 11 wt. % Zn and the resultant coating layer advantageously has no silicon present therein and hence magnesium may form in this layer.

Magnesium has the benefit that it can prevent corrosion where, for example, the coating film is cracked or where the base steel is exposed by e.g. cutting through the coated strip. In this regard the Mg in the coating layer can migrate to exposed regions and form oxides which prevent further corrosion of the base steel. Thus, Mg can prevent corrosion pitting, corrosion edge undercutting etc.

FIG. 4 schematically depicts the resultant coated metal substrate after solidification, with the coating layer comprising Al, Zn and Mg and the alloy layer comprising the quaternary alloy as described above.

Whilst the substrate is typically a metal sheet or strip, it should be appreciated that other more complex profiles and 3-dimensional shapes may be subjected to the method of coating using a vapour or electro-deposited alloy control material, as described and defined herein.

In addition, whilst specific embodiments of the method and coating have been described, it should be appreciated that the method and coating can be embodied in many other forms.

The invention claimed is:

1. A method for coating a steel strip substrate consisting of the steps of:
    (a) unwinding steel strip from a coil of the steel strip substrate;
    (b) cleaning the steel strip substrate;
    (c) depositing Si as an alloy control material onto the steel strip substrate by a physical or chemical vapour deposition technique or an electro-deposition technique and forming a layer of the alloy control material that is less than 0.5 µm;
    (d) heat treating the steel strip substrate after depositing the alloy control material on the steel strip substrate in step (c), so that the deposited alloy control material is pre-alloyed into a surface layer of the steel strip substrate;
    (e) passing the steel strip substrate through a bath of molten coating material comprising 40-60 wt. % Al, 40-60 wt. % Zn, and up to 5 wt. % Mg, wherein the bath of molten coating material does not contain the elements silicon and titanium as deliberate additives, and forming a coating of the coating material onto the deposited alloy control material, with the coating material diffusing into the layer of the alloy control material before solidification of the coating and forming an Al—Fe—Zn-alloy control material alloy between the steel strip substrate and the coating that prevents excessive alloying between the steel of the steel strip substrate and one or more components of the coating material in the coating; and
    (f) quench cooling the coated substrate.

2. The method defined in claim 1 wherein the bath of molten coating material does not contain any one or more of the elements, calcium, manganese, potassium, bismuth, cerium, and lanthanum as deliberate additives.

* * * * *